(12) United States Patent
Park et al.

(10) Patent No.: US 9,666,819 B2
(45) Date of Patent: May 30, 2017

(54) ORGANIC LIGHT EMITTING DIODE AND DISPLAY DEVICE INCLUDING THE SAME

(71) Applicant: Samsung Display Co., Ltd., Yongin-si (KR)

(72) Inventors: Youngseo Park, Seoul (KR); Jungmin Moon, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/856,963

(22) Filed: Sep. 17, 2015

(65) Prior Publication Data

US 2016/0204370 A1 Jul. 14, 2016

(30) Foreign Application Priority Data

Jan. 14, 2015 (KR) ........................ 10-2015-0007049

(51) Int. Cl.
*H01L 29/08* (2006.01)
*H01L 51/50* (2006.01)

(52) U.S. Cl.
CPC ...... *H01L 51/5008* (2013.01); *H01L 51/5004* (2013.01); *H01L 51/5056* (2013.01); *H01L 51/5096* (2013.01); *H01L 51/5072* (2013.01)

(58) Field of Classification Search
CPC .. H01L 51/5008; H01L 51/5012; H01L 27/32
See application file for complete search history.

(56) References Cited

U.S. PATENT DOCUMENTS

| 8,053,975 B2 | 11/2011 | Chun et al. |
| 8,916,856 B2 | 12/2014 | Ishizuya |
| 8,952,369 B2 | 2/2015 | Sonoyama |
| 2004/0146746 A1* | 7/2004 | Lee ........................ C07C 217/84 |
| | | 428/690 |
| 2008/0122350 A1* | 5/2008 | Sakata ................ H01L 51/5203 |
| | | 313/504 |

(Continued)

FOREIGN PATENT DOCUMENTS

| JP | 2013-118176 | 6/2013 |
| KR | 10-0829761 | 5/2008 |

(Continued)

*Primary Examiner* — Marc Armand
*Assistant Examiner* — Sarah Salerno
(74) *Attorney, Agent, or Firm* — H.C. Park & Associates, PLC

(57) ABSTRACT

An organic light emitting diode includes a first electrode layer disposed on a base substrate, a second electrode layer disposed on the first electrode layer and facing the first electrode layer, an emitting layer disposed between the first electrode layer and the second electrode layer, a hole transport region disposed between the emitting layer and the first electrode layer, an auxiliary layer disposed between the hole transport region and the emitting layer, the auxiliary layer including a first material and a second material, and an electron transport region disposed between the emitting layer and the second electrode layer, in which a lowest unoccupied molecular orbital (LUMO) energy level of the first material is higher than a LUMO energy level of the emitting layer, and a LUMO energy level of the second material is lower than the LUMO energy level of the emitting layer.

18 Claims, 10 Drawing Sheets

(56) References Cited

U.S. PATENT DOCUMENTS

2013/0341606 A1* 12/2013 Sonoyama .......... H01L 51/5096
    257/40
2014/0239287 A1  8/2014 Lee et al.

FOREIGN PATENT DOCUMENTS

| KR | 10-2012-0039872 | 4/2012 |
| KR | 10-2013-0039496 | 4/2013 |
| KR | 10-2014-0000635 | 1/2014 |

* cited by examiner

ORGANIC LIGHT EMITTING DIODE AND DISPLAY DEVICE INCLUDING THE SAME

CROSS-REFERENCE TO RELATED APPLICATION

This application claims priority from and the benefit of Korean Patent Application No. 10-2015-0007049, filed on Jan. 14, 2015, which is hereby incorporated by reference for all purposes as if fully set forth herein.

BACKGROUND

Field

Exemplary embodiments of the present invention relate to an organic light emitting diode and a display device including the same, and more particularly, to an organic light emitting diode having high luminescent efficiency and an improved lifespan and to a display device including the same Discussion of the Background An organic light emitting diode may have fast response speed, be driven at a low voltage, and is a self-light emitting type organic light emitting diode. Accordingly, a display device including the organic light emitting diode may be manufactured to have a compact size and be lightweight, since a separate light source may be omitted, and have excellent brightness, no viewing angle dependence, and the like.

The organic light emitting diode is a display diode having an emitting layer formed of an organic material disposed between an anode electrode and a cathode electrode. Holes supplied from the anode electrode and electrons supplied from the cathode electrode are combined in the emitting layer to generate excitons, and the excitons emit light corresponding to an energy gap between the hole and the electron.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a display device with improved luminescent efficiency and improved lifespan.

Additional aspects will be set forth in the detailed description which follows, and, in part, will be apparent from the disclosure, or may be learned by practice of the inventive concept.

According to an exemplary embodiment of the present invention, an organic light emitting diode includes a first electrode layer disposed on a base substrate, a second electrode layer disposed on the first electrode layer and facing the first electrode layer, an emitting layer disposed between the first electrode layer and the second electrode layer, a hole transport region disposed between the emitting layer and the first electrode layer, an auxiliary layer disposed between the hole transport region and the emitting layer, the auxiliary layer including a first material and a second material, and an electron transport region disposed between the emitting layer and the second electrode layer, in which a lowest unoccupied molecular orbital (LUMO) energy level of the first material is higher than a LUMO energy level of the emitting layer, and a LUMO energy level of the second material is lower than the LUMO energy level of the emitting layer.

The emitting layer may include a host material and a dopant material, and the LUMO energy level of the first material may be higher than a LUMO energy level of the host material, and the LUMO energy level of the second material may be lower than the LUMO energy level of the host material.

The emitting layer may further include a third material, and the third material may be the same as the second material.

An energy band gap of the third material may be larger than an energy band gap of the dopant material.

The auxiliary layer may include a first layer including the first material, and a second layer including the first and second materials, in which the first layer may be disposed between the second layer and the emitting layer, and the second layer may be disposed between the first layer and the hole transport region.

The auxiliary layer may further include a third layer including the first material disposed between the second layer and the hole transport region.

Each of a highest occupied molecular orbital (HOMO) energy level of the first material and a HOMO energy level of the second material may be higher than a HOMO energy level of the host material.

The HOMO energy level of the first material may be higher than the HOMO energy level of the second material.

The auxiliary layer may have a thickness proportional to a wavelength of light emitted from the emitting layer, and a resonance distance between the first and second electrodes may be adjusted by the thickness of the auxiliary layer.

According to an exemplary embodiment of the present invention, a display device includes a base substrate, and pixels disposed on the base substrate, each of the pixels including an organic light emitting diode, in which the organic light emitting diode includes a first electrode layer disposed on the base substrate, a second electrode layer disposed on the first electrode layer and facing the first electrode layer, an emitting layer disposed between the first and second electrode layers, a hole transport region disposed between the emitting layer and the first electrode layer, an electron transport region disposed between the emitting layer and the second electrode layer, and an auxiliary layer disposed between the hole transport region and the emitting layer, the auxiliary layer including a first material having a lowest unoccupied molecular orbital (LUMO) energy level higher than a LUMO energy level of the emitting layer, and a second material having a LUMO energy level lower than the LUMO energy level of the emitting layer.

The emitting layer may include a host material and a dopant material, and the LUMO energy level of the first material may be higher than a LUMO energy level of the host material, and the LUMO energy level of the second material may be lower than the LUMO energy level of the host material.

The emitting layer may further include a third material, and the third material may be the same as the second material and an energy band gap of the third material may be larger than an energy band gap of the dopant material.

The auxiliary layer may include a first layer including the first material, and a second layer including the first and second materials, in which the first layer may be disposed between the second layer and the emitting layer, and the second layer may be disposed between the first layer and the hole transport region.

The auxiliary layer may further include a third layer including the first material disposed between the second layer and the hole transport region.

A highest occupied molecular orbital (HOMO) energy level of the first material and a HOMO energy level of the second material may be respectively higher than a HOMO energy level of the host material.

The emitting layer may include a first emitting layer emitting light having a first wavelength and a second emitting layer emitting light having a second wavelength shorter than the first wavelength, and when the auxiliary layer may include a first auxiliary layer disposed between the first emitting layer and the hole transport region and a second auxiliary layer disposed between the second emitting layer and the hole transport region, the first auxiliary layer may be thicker than the second auxiliary layer.

According to an exemplary embodiment of the present invention, a method of manufacturing an organic light emitting diode includes forming a first electrode layer on a base substrate, forming a hole transport region on the first electrode layer, forming an auxiliary layer including a first material and a second material on the hole transport region, forming an emitting layer on the auxiliary layer, forming an electron transport region on the emitting layer, and forming a second electrode layer on the electron transport region, in which a lowest unoccupied molecular orbital (LUMO) energy level of the first material is higher than a LUMO energy level of the emitting layer, and a LUMO energy level of the second material is lower than the LUMO energy level of the emitting layer.

A highest occupied molecular orbital (HOMO) energy level of the first material is higher than a HOMO energy level of the second material.

Each of the HOMO energy level of the first material and the HOMO energy level of the second material is higher than a HOMO energy level of a host material of the emitting layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept and, together with the description, serve to explain principles of the inventive concept.

DETAILED DESCRIPTION OF THE ILLUSTRATED EMBODIMENTS

Figure 1:
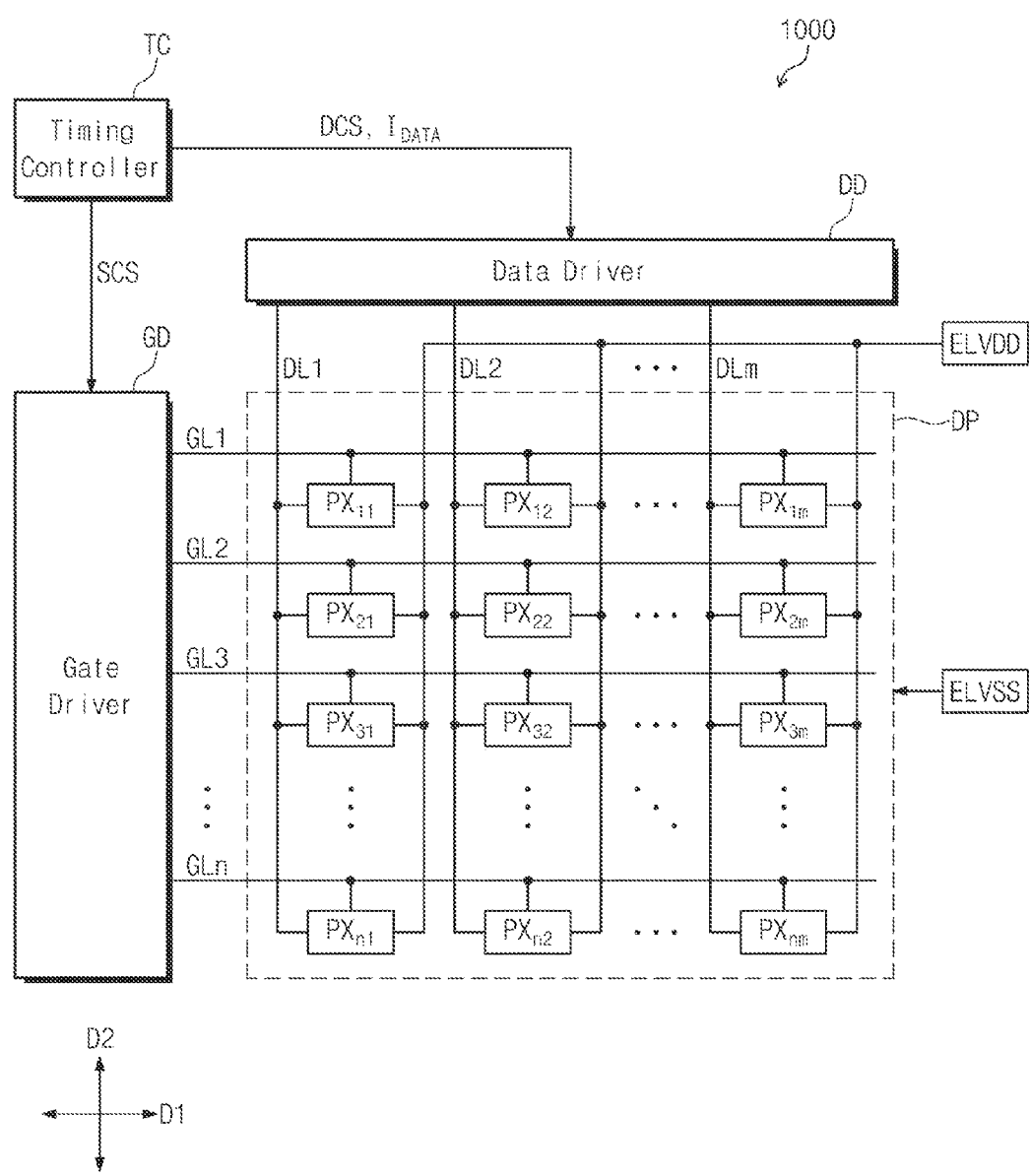
FIG. 1 is a block diagram of a display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
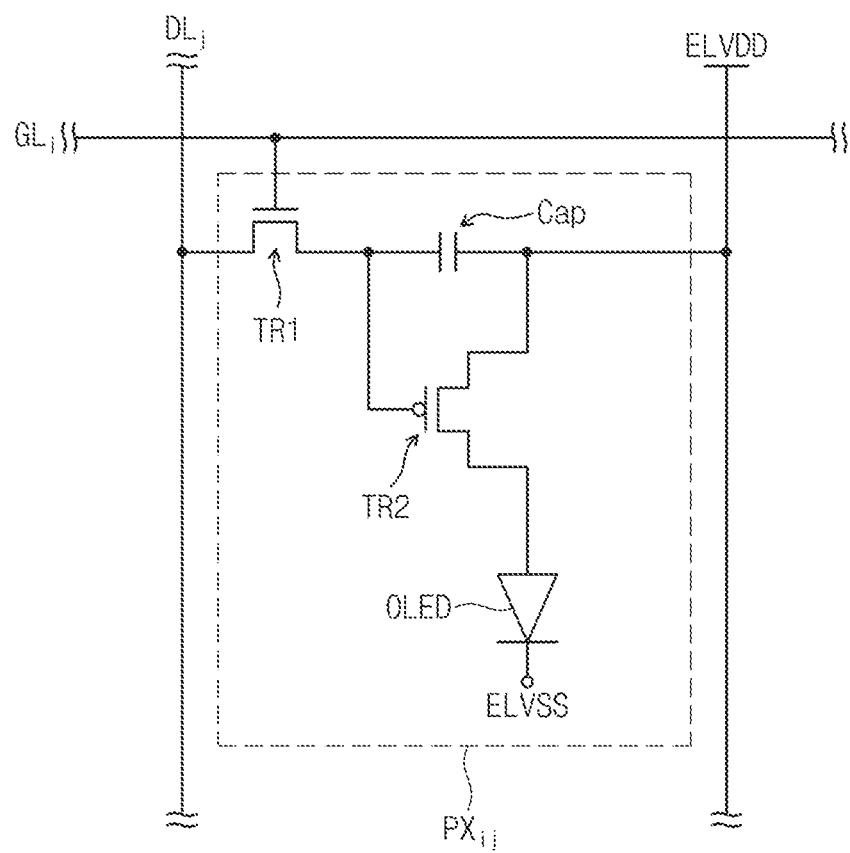
FIG. 2 is an equivalent circuit diagram of the pixels in FIG. 1.

FIG. 1 is a block diagram of a display device according to an exemplary embodiment of the present invention, and FIG. 2 is an equivalent circuit diagram of the pixels in FIG. 1.

Referring to FIGS. 1 and 2, a display device 1000 includes a display panel DP, a timing controller TC, a gate driver GD, and a data driver DD.

The timing controller TC receives an input image signal, and outputs an image data $I_{DATA}$ and various control signals SCS and DCS converted to conform to an operating mode of the display panel DP.

The gate driver GD receives a gate driver control signal SCS from the timing controller TC. The gate driver GD which has received the gate driver control signal SCS generates gate signals. The gate signals are sequentially supplied to the display panel DP.

The data driver DD receives a data driver control signal DCS and the converted image data $I_{DATA}$ from the timing controller TC. The data driver DD generates data signals based on the data driver control signal DCS and the converted image data $I_{DATA}$. The data signals are supplied to the display panel DP.

The display panel DP receives an electric signal from outside to display an image. The display panel DP includes gate lines GL1-GLn, data lines DL1-DLm, and pixels $PX_{11}$-PXnm.

The gate lines GL1-GLn extend in a first direction D1, and are arranged in a second direction D2 intersecting the first direction D1. The gate lines GL1-GLn are sequentially supplied with the gate signals from the gate driver GD.

The data lines DL1-DLm intersect the gate lines GL1-GLn and are insulated from the gate lines GL1-GLn. The data lines DL1-DLm extend in the second direction D2 and are arranged in the first direction D1. The data lines DL1-DLm receive the data signals from the data driver DD.

The display panel DP is supplied with a first power supply voltage ELVDD and a second power supply voltage ELVSS. Each of the pixels $PX_{11}$-PXnm turns on in response to a corresponding gate signal. Each of the pixels $PX_{11}$-PXnm receives the first power supply voltage ELVDD and the second power supply voltage ELVSS, and emits light in response to a corresponding data signal. The first power supply voltage ELVDD has a higher voltage level than the second power supply voltage ELVSS.

The pixels $PX_{11}$-PXnm may be arranged in a matrix configuration. The pixels $PX_{11}$-PXnm are connected to the corresponding gate lines GL1-GLn, and the pixels $PX_{11}$-PXnm are connected to the corresponding data lines DL1-DLm.

Each of the pixels $PX_{11}$-PXnm receives the gate signal from the corresponding gate line and the data signal from the corresponding data line. Each of the pixels $PX_{11}$-PXnm turns on in response to a corresponding gate signal. Each of the pixels $PX_{11}$-PXnm emits light corresponding to the corresponding data signal to display an image.

Each of the pixels $PX_{11}$-PXnm includes at least one transistor, at least one capacitor, and an organic light emitting diode. FIG. 2 illustrates an equivalent circuit of a pixel PXij connected to an i-th gate line GLi among the gate lines GL1-GLn and to a j-th data line DLj among the data lines DL1-DLm.

The pixel PXij includes a first transistor TR1, a second transistor TR2, a capacitor Cap, and an organic light emitting diode OLED as a display device. The first transistor TR1 includes a control electrode connected to the gate line GLi, an input electrode connected to the data line DLj, and an output electrode. The first transistor TR1 outputs a data signal flowing through the data line DLj in response to the gate signal flowing through the gate line GLi.

The capacitor Cap includes a first capacitor electrode connected to the first transistor TR1 and a second capacitor electrode receiving the first power supply voltage ELVDD. The capacitor Cap is charged with a charge amount corresponding to a difference between a voltage corresponding to the data signal received from the first transistor TR1 and the first power supply voltage ELVDD.

The second transistor TR2 includes a control electrode connected to the output electrode of the first transistor TR1 and to the first capacitor electrode of the capacitor Cap, an input electrode receiving the first power supply voltage ELVDD, and an output electrode. The output electrode of the second electrode TR2 is connected to the OLED.

The second transistor TR2 controls a drive current flowing in the OLED to correspond to the amount of charge stored in the capacitor Cap. The turn-on time of the second transistor TR2 is determined according to the charge amount charged in the capacitor Cap. The output electrode of the second electrode TR2 may supply voltage of a lower level than the first power supply voltage ELVDD to the OLED.

The OLED is connected to the second transistor TR2 and receives the second power supply voltage ELVSS. The OLED emits light during the turn-on period of the second transistor TR2.

The OLED includes an emitting material. The OLED may emit light of a color corresponding to the emitting material. Color of light emitted in the OLED may be any one of red, green, blue, and white light. Detailed description of the OLED will be described below.

Figure 3:
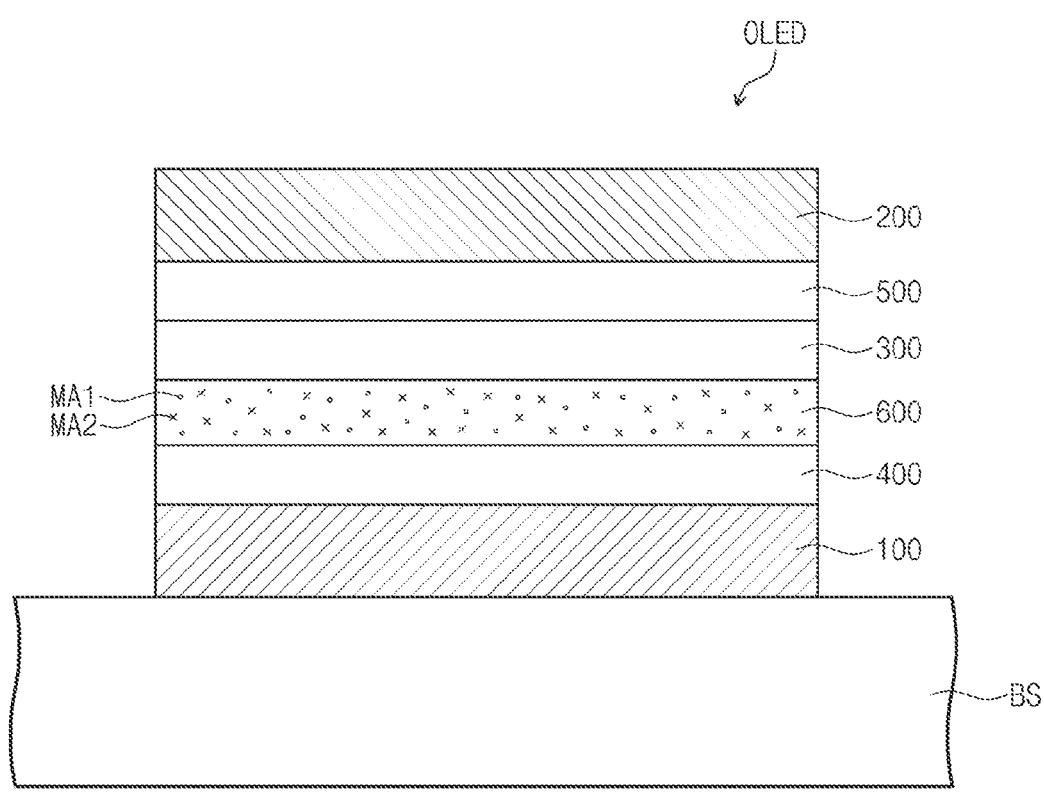
FIG. 3 is a cross-sectional view of an organic light emitting diode according to an exemplary embodiment of the present invention.

FIG. 3 is a cross-sectional view of an organic light emitting diode according to an exemplary embodiment of the present invention.

Referring to FIG. 3, an OLED may include a first electrode layer 100, a second electrode layer 200, an emitting layer 300, a hole transport region 400, an electron transport region 500, and an auxiliary layer 600.

The OLED may be disposed on a base substrate BS. The base substrate BS may include thin films (not shown). The thin films may include an inorganic thin film and/or an organic thin film.

The thin films may include the first transistor (TR1 in FIG. 2), the second transistor (TR2 in FIG. 2), the capacitor (Cap in FIG. 2), and insulating layers disposed between the first transistor (TR1 in FIG. 2), the second transistor (TR2 in FIG. 2), and the capacitor (Cap in FIG. 2).

The first electrode layer 100 may be disposed on the base substrate BS. Although not shown, the first electrode layer 100 may be electrically connected to the second transistor (TR2 in FIG. 2). In this case, the first electrode layer 100 may be connected to the second transistor (TR2 in FIG. 2) through a through-hole (not shown).

The first electrode layer 100 may be a pixel electrode or an anode electrode. The first electrode layer 100 may be formed of a material having a high work function to facilitate hole injection.

The first electrode layer 100 may include a conductive material. The first electrode layer 100 may be a transmissive electrode, a semi-transmissive electrode, or a reflective electrode. Alternatively, the first electrode layer 100 may be formed of a variety of materials according to a structure of the OLED.

When the first electrode layer 100 is a transmissive electrode, the first electrode layer 100 may be formed of a transparent metal oxide, for example, indium tin oxide (ITO), indium zinc oxide (IZO), zinc oxide (ZnO), indium tin zinc oxide (ITZO). When the first electrode layer 100 is a semi-transmissive electrode or a reflective electrode, the first electrode layer 100 may include Ag, Mg, Al, Pt, Pd, Au, Ni, Nd, Ir, Cr, or a mixture thereof.

The first electrode layer 100 may have a single-layer structure or a multi-layer structure, each layer being formed of a transparent metal oxide or a metal. For example, the first electrode layer 100 may have a single-layer structure formed of ITO, Ag or a metal mixture (e.g., a mixture of Ag and Mg), a two-layer structure of ITO/Mg or ITO/MgF, or a three-layer structure of ITO/Ag/ITO.

The second electrode layer 200 may be disposed on the first electrode layer 100. The second electrode layer 200 may be a common electrode or a cathode electrode. Accordingly, the second electrode layer 200 may be formed of a material having a low work function to facilitate electron injection.

The second electrode layer 200 may be a single-layer or a multi-layer. The multi-layer may include at least one of a layer including a reflective material and a layer including a transmissive material. The second electrode layer 200 may be a reflective, semi-transmissive, or transmissive electrode.

The second electrode layer 200 may be formed of a variety of materials according to a structure of the OLED.

When the second electrode layer 200 is a transmissive electrode, the second electrode layer 200 may include Li, Ca, LiF/Ca, LiF/Al, Al, Mg, BaF, Ba, Ag, or a compound thereof, or a mixture thereof (e.g., a mixture of Ag and Mg). The second electrode layer 200 may include an auxiliary electrode. The auxiliary electrode may include a film formed to face the emitting layer 300 by depositing any of the foregoing materials, and the film may include a transparent metal oxide, such as indium tin oxide (ITO), indium zinc oxide (IZO), zinc oxide (ZnO), or indium tin zinc oxide (ITZO). Alternatively, the auxiliary electrode may include Mo and Ti.

When the second electrode layer 200 is a semi-transmissive electrode or a reflective electrode, the second electrode layer 200 may include Ag, Mg, Al, Pt, Pd, Au, Ni, Nd, Ir, Cr, Li, Ca, LiF/Ca, LiF/Al, Mo, Ti or a compound thereof, or a mixture thereof (e.g., a mixture of Ag and Mg). Alternatively, the second electrode layer 200 may have a multi-layer structure including a reflective film or semi-transmissive film formed of any of the foregoing iii materials, and a transparent conductive film formed of indium tin oxide (ITO), indium zinc oxide (IZO), zinc oxide (ZnO), indium tin zinc oxide (ITZO), or the like.

When the OLED is a top emission type organic light emitting diode, the first electrode layer 100 may be a reflective electrode, and the second electrode layer 200 may be a transmissive electrode or a semi-transmissive electrode. In this case, an organic capping layer (not shown) may be further disposed on the first electrode layer 100. The organic capping layer may have a refractive index of about 1.8 to about 2.4. The organic capping layer may reflect light emitted from the emitting layer 300 toward the emitting layer 300 direction. Since the reflected light is amplified inside an organic layer by a resonance effect, luminescent efficiency of a display device (1000 in FIG. 1) may be improved.

The emitting layer 300 may be disposed between the first electrode layer 100 and the second electrode layer 200. The emitting layer 300 may be a single-layer of a single material, a single-layer of multiple materials different form each other, or a multi-layer structure having multiple layers of multiple materials different from each other.

The emitting layer 300 may be formed by using any of various methods such as vacuum deposition, spin coating, casting, a Langmuir-Blodgett (LB) method, an inkjet printing method, a laser printing method, a laser induced thermal imaging (LITI) method.

The emitting layer 300 may be formed of a typically available material, for example, a material emitting red, green, and blue light, and may include a fluorescent material or a phosphorescent material. Further, the emitting layer 300 may include a host material and a dopant material.

The host material may include a typically available host material, for example, tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-Methyl-9,10-bis(naphthalen-2-yl)an-thracene (MADN), or the like.

When the emitting layer 300 emits red light, the emitting layer 300 may include, for example, a fluorescent material including PBD:Eu(DBM)3(Phen)(tris(dibenzoylmethanato)

phenanthoroline europium) or perylene. When the emitting layer 300 emits red light, the dopant material included in the emitting layer 300 may be selected from a metal complex or an organometallic complex, such as acac(bis(1-phenylisoquinoline)acetylacetonate iridium (PIQIr), acac(bis(1-phenylquinoline)acetylacetonate iridium (PQIr), tris(1-phenylquinoline)iridium (PQIr), and octaethylporphyrin platinum (PtOEP).

When the emitting layer 300 emits green light, the emitting layer 300 may include, for example, a fluorescent material including tris(8-hydroxyquinolino)aluminum (Alq3). When the emitting layer 300 emits green light, the dopant material included in the emitting layer 300 may be selected from a metal complex or an organometallic complex, such as Ir(ppy)3(fac-tris(2-phenylpyridine)iridium).

When the emitting layer 300 emits blue light, the emitting layer 300 may include, for example, a fluorescent material including at least one of spiro-DPVBi, spiro-6P, distyrylbenzene (DSB), distyryl-arylene (DSA), Polyfluorene (PFO) polymers, and poly(p-phenylene vinylene (PPV) polymers. When the emitting layer 300 emits blue light, the dopant material included in the emitting layer 300 may be selected from a metal complex or an organometallic complex such as (4,6-F2ppy)2Irpic.

The hole transport region 400 may be defined between the auxiliary layer 600 and the first electrode layer 100. The hole transport region 400 may be a region where a hole injected from the first electrode layer 100 passes through to reach the emitting layer 300.

The hole transport region 400 may include at least one of a hole injection layer, the hole transport layer, and a single layer having a hole injection function and a hole transport function at the same time. The hole transport region 400 may include at least one of a hole injection material and a hole transport material.

When the hole transport region 400 includes the hole injection layer, the hole transport region 400 may include a phthalocyanine compound, such as copper phthalocyanine, N,N'-diphenyl-N,N'-bis-[4-(phenyl-m-tolyl-amino)-phenyl]-biphenyl-4,4'-diamine (DNTPD), 4,4',4''-tris(3-methylphenylphenylamino)triphenylamine (m-MTDATA), 4,4',4''-Tris(N,N-diphenylamino)triphenylamine (TDATA), 4,4',4''-tris{N,-(2-naphthyl)-N-phenylamino}-triphenylamine (2TNATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonicacid (PANI/CSA), and (Polyaniline)/Poly(4-styrenesulfonate) (PANI/PSS).

When the hole transport region 400 includes hole transport layer, the hole transport region 400 may include a carbazole derivative, such as N-phenyl carbazole, polyvinyl carbazole, a fluorine derivative, a triphenylamine derivative, such as N,N'-bis(3-methylphenyl)-N,N'-diphenyl-[1,1-biphenyl]-4,4'-diamine (TPD), 4,4',4''-tris(N-carbazolyl)triphenylamine (TCTA); N,N'-di(1-naphthyl)-N,N'-diphenylbenzidine (NPB), and 4,4'-Cyclohexylidene bis[N,N-bis(4-methylphenyl)benzenamine] (TAPC).

The thickness of the hole transport region 400 may range from about 100 Å to about 10000 Å, and in more detail, from about 100 Å to about 1000 Å. When the hole transport region 400 includes both the hole injection layer and the hole transport layer, the thickness of the hole injection layer may range from about 100 Å to about 10000 Å, and in more detail, from about 100 Å to about 1000 Å, and the thickness of the hole transport layer may range from about 50 Å to about 2000 Å, and in more detail, from about 100 Å to about 1500 Å. When the thickness of the hole transport layer satisfies the above mentioned range, a satisfactory hole transport property may be obtained without a substantial rise in driving voltage.

The hole transport region 400 may further include a charge generating material to improve the conductivity thereof in addition to above-mentioned materials. The charge generating material may be uniformly or non-uniformly dispersed in the hole transport region 400. The charge generating material may be, for example, a p-dopant material. The p-dopant material may be one of a quinine derivative, a metal oxide, and a cyano group-containing compound. For example, the p-dopant material may include a quinone derivative, such as tetracyanoquinodimethane (TCNQ) or 2,3,5,6-tetrafluoro-tetracyanoquinodimethane (F4-TCNQ), and a metal oxide such as tungsten oxide or molybdenum oxide.

The hole transport region 400 may be formed by using any of various of methods such as vacuum deposition, spin coating, casting, a Langmuir-Blodgett (LB) method, an inkjet printing method, a laser printing method, and a laser induced thermal imaging (LITI) method.

The electron transport region 500 may be defined between the emitting layer 300 and the second electrode layer 200. The electron transport region 500 may be a region where an electron injected from the second electrode layer 200 passes through to reach the emitting layer 300.

The electron transport region 500 may include at least one of a hole blocking layer, an electron transport layer, and an electron injection layer. For example, the electron transport region 500 may have any of the following structures, including electron transport layer/electron injection layer and hole blocking layer/electron transport layer/electron injection layer, in which the respective layers are sequentially stacked from the emitting layer 300, or a single-layer structure, in which two or more layers of the above layers are mixed.

When the electron transport region 500 includes the electron transport layer, the electron transport region 500 may include, Tris(8-hydroxyquinolinato)aluminum (Alq3), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate) (Bebq2), 9,10-di(naphthalene-2-yl)anthracene (ADN), and a mixture thereof.

The thickness of the electron transport layer may range from about 100 Å to about 1000 Å, and in more detail, from about 150 Å to about 500 Å. When the thickness of the electron transport layer satisfies the above mentioned range, a satisfactory electron transport property may be obtained without a substantial rise in driving voltage.

When the electron transport region 500 includes the electron injection layer, the electron transport region 500 may use lithium fluoride (LiF), lithium quinolate (LiQ), lithium oxide ($Li_2O$), barium oxide (BaO), sodium chloride (NaCl), caesium fluoride (CsF), a lanthanide metal such as Yb, or a metal halide such as rubidium chloride (RbCl), rubidium iodide (RbI). The electron injection layer may also include a material in which an electron transport material and an insulating organo metal salt are mixed. The organo metal salt may be a material having an energy band gap of about 4 eV or higher. Specifically, for example, the organic metal salt may include metal acetate, metal benzoate, metal acetoacetate, metal acetylacetonate, or metal stearate.

The thickness of the electron injection layer may range from about 1 Å to about 100 Å, and in more detail, from about 3 Å to about 90 Å. When the thickness of the electron injection layer satisfies the above mentioned range, a satisfactory electron injection property may be obtained without a substantial rise in driving voltage.

The electron transport region 500 may include a hole blocking layer as mentioned above. The hole blocking layer may include, for example, at least one of 2,9-dimethyl-4,7-diphenyl-1,10-phenanthroline (BCP) and 4,7-diphenyl-1,10-phenanthroline (Bphen). The thickness of the hole blocking layer may range from about 20 Å to about 1000 Å, and in more detail, from about 30 Å to about 300 Å. When the thickness of the hole blocking layer satisfies the above mentioned range, an excellent hole-blocking property may be obtained without a substantial rise in a driving voltage.

The electron transport region 500 may be formed by using any of various of methods such as vacuum deposition, spin coating, casting, a Langmuir-Blodgett (LB) method, an inkjet printing method, a laser printing method, and a laser induced thermal imaging (LITI) method.

The auxiliary layer 600 may be disposed between the hole transport region 400 and the emitting layer 300. The auxiliary layer 600 may prevent an electron passed from the emitting layer 300 from being injected into the hole transport region 400.

The auxiliary layer 600 may include a first material MA1 and a second material MA2.

The first material MA1 may be an electron blocking material. The electron blocking material may be a material having a lowest unoccupied molecular orbital (LUMO) energy level higher than a LUMO energy level of the emitting layer 300. For example, the electron blocking material may include triphenylamine, carbazole, spirofluorene, oxadiazole, triazole, and phenanthroline, or respective derivatives of triphenylamine, carbazole, spirofluorene, oxadiazole, triazole, and phenanthroline, or the like.

Since the first material MA1 allows excitons to be easily formed inside the emitting layer 300 by blocking a flow of electrons to the hole transport region 400 at an interface between the emitting layer 300 and the auxiliary layer 600, luminescent efficiency of the OLED may be improved.

The second material MA2 may be an electron trapping material. The electron tapping material may be a material having a LUMO energy level lower than the LUMO energy level of the emitting layer 300. For example, the electron trapping material may include at least one compound selected from the group consisting of benzene, naphthalene, anthracene, pyrene, perillin, triphenylene, pentatron, chrysene, fluorine, and sprofluorene, or respective derivatives of benzene, naphthalene, anthracene, pyrene, perillin, triphenylene, pentatron, chrysene, fluorine, and sprofluorene, or the like.

The second material MA2 may prevent excess electrons introduced into the auxiliary layer 600 from being moved to the hole transport region 400. In addition, the second material MA2 may prevent excess electrons from being concentrated on an interface between the auxiliary layer 600 and the emitting layer 300, and thus prevent the interface between the auxiliary layer 600 and the emitting layer 300 from being deteriorated. Therefore, a reduction in lifespan of the OLED may be suppressed.

According to the present exemplary embodiment, luminescent efficiency of the organic light emitting diode may be improved by the auxiliary layer 600 in which the first material MA1 and the second material MA2 are mixed, and a reduction in lifespan of the OLED may be also suppressed.

Figure 4:
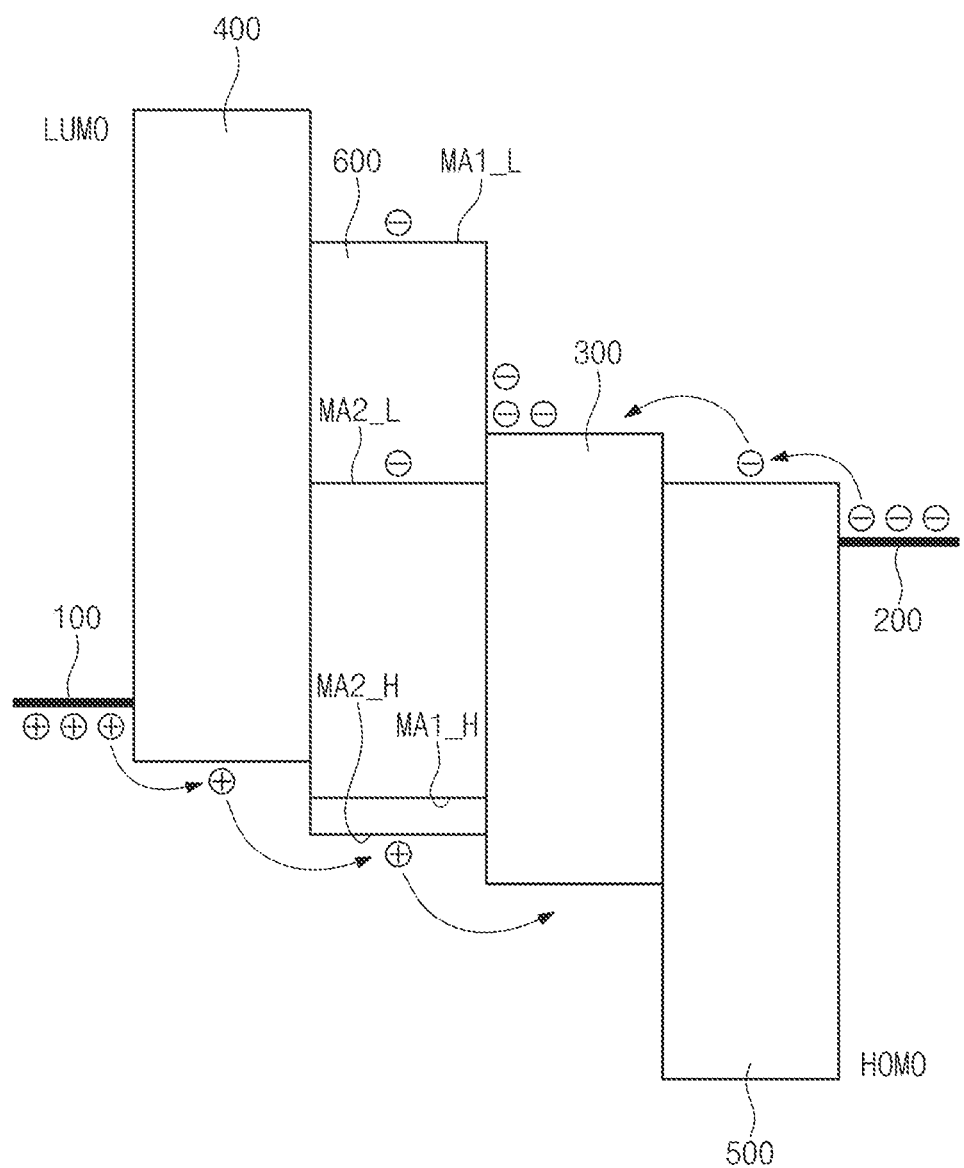
FIG. 4 is a band diagram of the organic light emitting diode in FIG. 3.

FIG. 4 is a band diagram of the organic light emitting diode in FIG. 3.

Referring to FIGS. 3 and 4, the OLED may include layers having different energy bands from each other.

In general, a bonding force between molecules of an organic material is relatively very weak compared to that in ionic bonding or the like. Therefore, an electron energy level of organic layers may be quantized to be represented by an energy band having a predetermined gap. An energy band of the organic layers may be defined by a gap between a lowest unoccupied molecular orbital (LUMO) energy level and a highest occupied molecular orbital (HOMO) energy level.

The LUMO energy level is a lowest energy level that is not occupied by an electron, and may correspond to a bottom energy level of a conduction band of an inorganic semiconductor. The LUMO energy level may correspond to an electron affinity of a relevant layer.

When a predetermined electric field is applied to the OLED, electrons in the second electrode layer (200, cathode) move to an adjacent layer by the electric field. At this time, the higher the LUMO energy level difference between the adjacent layers is, the higher electric field is required.

The LUMO energy level is related to movement of an electron. An electron may move from a layer having low LUMO energy level to a layer having a high LUMO energy level by an applied electric field. In general, the electron transport region 500 has a LUMO energy level between a work function of the emitting layer (200, cathode) and a LUMO energy level of the emitting layer 300. Further, when the electron transport region 500 is formed of multiple layers, a LUMO energy level of the layers may be increased as the layers are disposed closer to the emitting layer 300 from the second electrode layer 200.

The HOMO energy level is a highest energy level occupied with electrons. The HOMO energy level may correspond to an upper energy level of a valence band of the inorganic semiconductor. The LUMO energy level of layers may correspond to an ionization potential. The ionization potential is an energy required to ionize a material, and the higher the ionization potential of a material, the more difficult it is to ionize the material.

When a predetermined electric field is applied to the OLED, holes in the first electrode layer (100, anode) move to an adjacent layer by the electric field. At this time, the higher the energy level difference between the adjacent layers, the higher electric field is required.

The HOMO energy level is related to movement of holes. Holes may move from a layer of high HOMO energy level to a layer of low HOMO energy level by applied electric field. In general, the hole transport region 400 has a HOMO energy level between a work function of the first electrode layer 100 and a HOMO energy level of the emitting layer 300. Further, when the hole transport region 400 is formed of multiple layers, HOMO energy levels of the layers may be decreased as the layers are disposed closer to the emitting layer 300 from the first electrode layer 100.

A HOMO energy level of the auxiliary layer 600 may have an intermediate value between the HOMO energy level of the hole transport region 400 and the HOMO energy level of the emitting layer 300. For example, a HOMO energy level $MA1\_H$ of the first material MA1 and a HOMO energy level $MA2\_H$ of the second material MA2 may be higher than the HOMO energy level of the emitting layer 300, and may be lower than the HOMO energy level of the hole transport region 400. Thus, holes may easily move to the emitting layer 300 via the hole transport region 400 and the auxiliary layer 600.

The LUMO energy level MA1_L of the first material MA1 may be higher than the LUMO energy level of the emitting layer 300, the LUMO energy level MA2_L of the second material MA2 may be lower than the LUMO energy level of the emitting layer 300. For example, when the LUMO energy level of the emitting layer 300 is −2.1 eV, the LUMO energy level MA1_L of the first material MA1 may be −1.5 eV, and the LUMO energy level MA2_L of the second material MA2 may be −2.3 eV. Alternatively, the LUMO energy level MA1_L of the first material MA1 and the LUMO energy level MA2_L of the second material MA2 may be determined according to the LUMO energy level of the emitting layer 300.

Since the first material MA1 has a higher LUMO energy level MA1_L than the emitting layer 300, the first material MA1 may prevent electrons from moving from the emitting layer 300 to the hole transport region 400. Therefore, excitons may be more easily formed in the emitting layer 300, and as a result, luminescent efficiency of the organic light emitting diode may be improved.

Since the second material MA2 has a lower LUMO energy level MA2_L than the emitting layer 300, the second material MA2 may prevent excess electrons introduced into the auxiliary layer 600 from moving to the hole transport region 400. In addition, an interface between the emitting layer 300 and the auxiliary layer 600 may be prevented from being deteriorated by trapping some of the excess electrons, and as a result, a lifespan of the organic light emitting diode may be improved.

The LUMO energy level of the emitting layer 300 may be a LUMO energy level of the host material included in the emitting layer 300. The host material may be distributed over the entire surface of the emitting layer 300, and the dopant material is either evenly dispersed in the emitting layer 300, or may be locally doped in the emitting layer 300. Therefore, FIG. 4 illustrates a LUMO energy level and a HOMO energy level of the host material forming the emitting layer 300.

More particularly, the dopant material of the emitting layer 300 may become an impurity with respect to the host material, and the probability that electrons and holes may move along the LUMO energy level and HOMO energy level of the host material may be higher. Therefore, the LUMO energy level MA1_L of the first material MA1 may be higher than a LUMO energy level of the emitting layer 300, and the LUMO energy level MA2_L of the second material MA2 may be lower than the LUMO energy level of the emitting layer 300.

Figure 5:
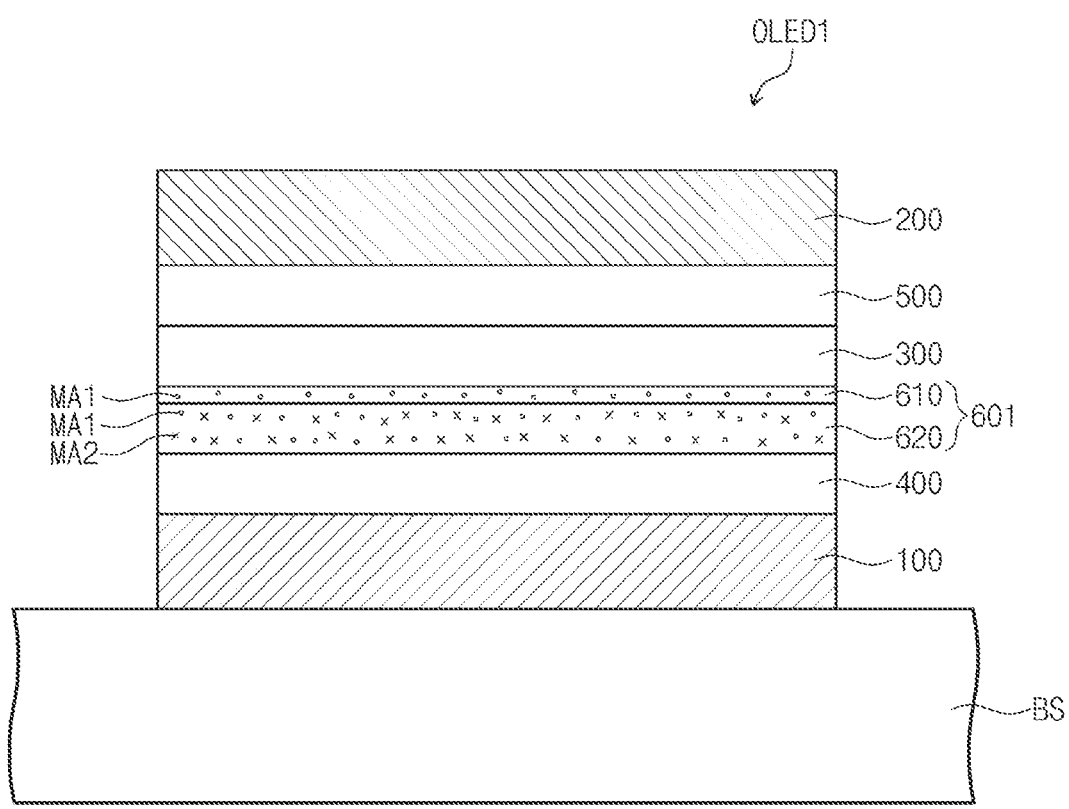
FIG. 5 is a cross-sectional view of an organic light emitting diode according to an exemplary embodiment of the present invention.
Figure 6:
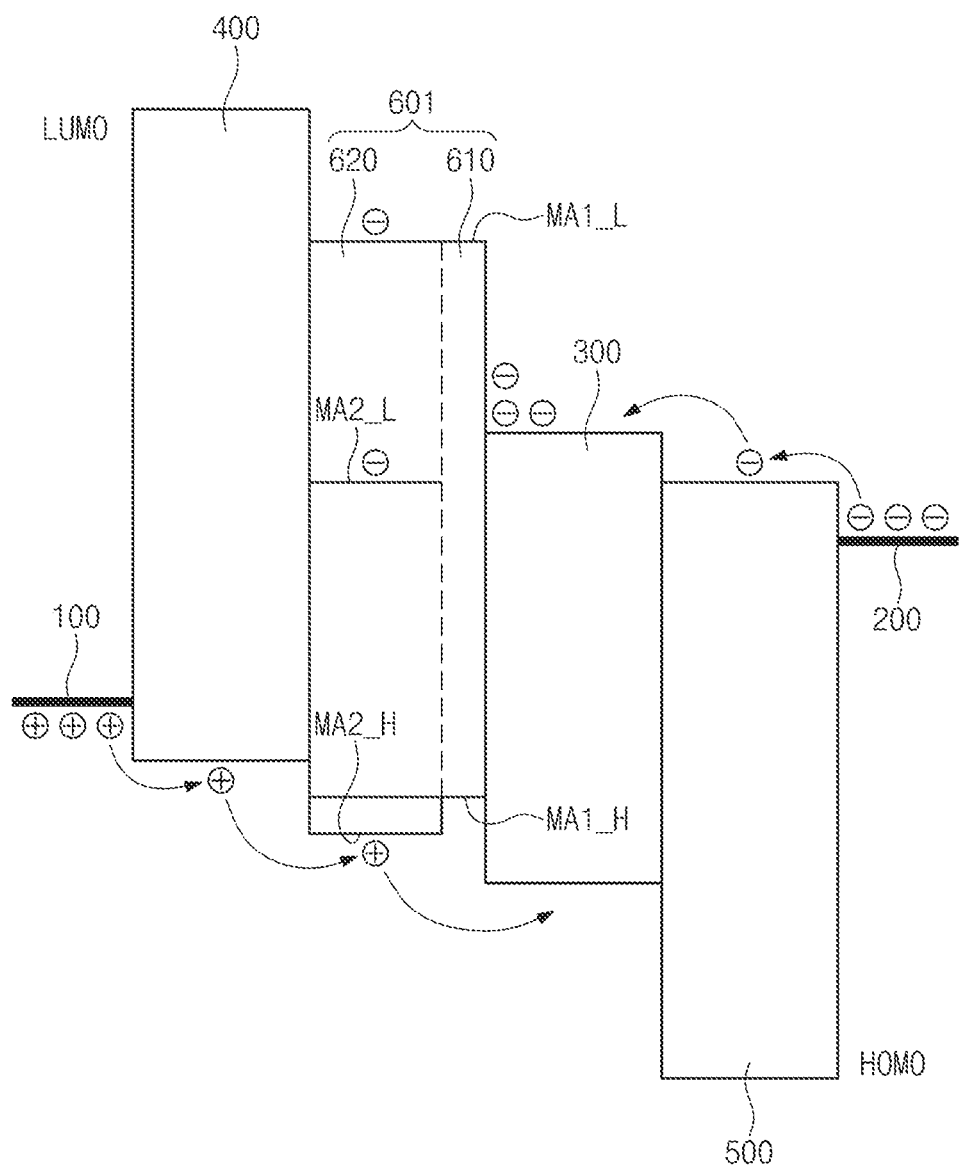
FIG. 6 is a band diagram of the organic light emitting diode in FIG. 5.

FIG. 5 is a cross-sectional view of an organic light emitting diode according to an exemplary embodiment of the present invention and FIG. 6 is a band diagram of the organic light emitting diode in FIG. 5. In FIGS. 5 and 6, like reference numerals are given to denote the same constituent elements as those described with reference to FIGS. 3 and 4, and repeated descriptions for the above constituent elements will be omitted.

Referring to FIGS. 5 and 6, an auxiliary layer 601 may include a first layer 610 and a second layer 620.

The first layer 610 is disposed between an emitting layer 300 and the second layer 620, and the second layer 620 may be disposed between the first layer 610 and a hole transport region 400. According to the present exemplary embodiment, the first layer 610 may include a first material MA1, and the second layer 620 may include the first material MA1 and a second material MA2.

In the present exemplary embodiment, the second material MA2 with a low LUMO energy level MA2_L may be disposed to be spaced apart from the emitting layer 300. Accordingly, electron in the emitting layer 300 may be prevented from being leaked from the emitting layer 300 through the auxiliary layer 601. In addition, the second material MA2 may trap some of excess electrons introduced into the auxiliary layer 601. Therefore, some of the excess electrons may be trapped by the second material MA2, and as a result, an interface between the emitting layer 300 and the auxiliary layer 601 may be prevented from being deteriorated. In addition, since the auxiliary layer 601 may prevent the excess electrons having passed through the emitting layer 300 from moving to the hole transport region 400, a lifespan characteristic of the organic light emitting diode OLED1 may be improved.

According to an exemplary embodiment of the present invention, the auxiliary layer 601 may further include a third layer (not shown) including the first material MA1. The third layer may be disposed between the second layer 620 and the hole transport region 400. In other words, the second material MA2 is disposed only in a middle area of the auxiliary layer 601, thus not contacting with both the hole transport region 400 and the emitting layer 300. The second material MA2 may be evenly dispersed in the auxiliary layer 600 as illustrated in FIG. 4, and may be unevenly dispersed in the auxiliary layer 601 as illustrated in FIG. 6.

Figure 7:
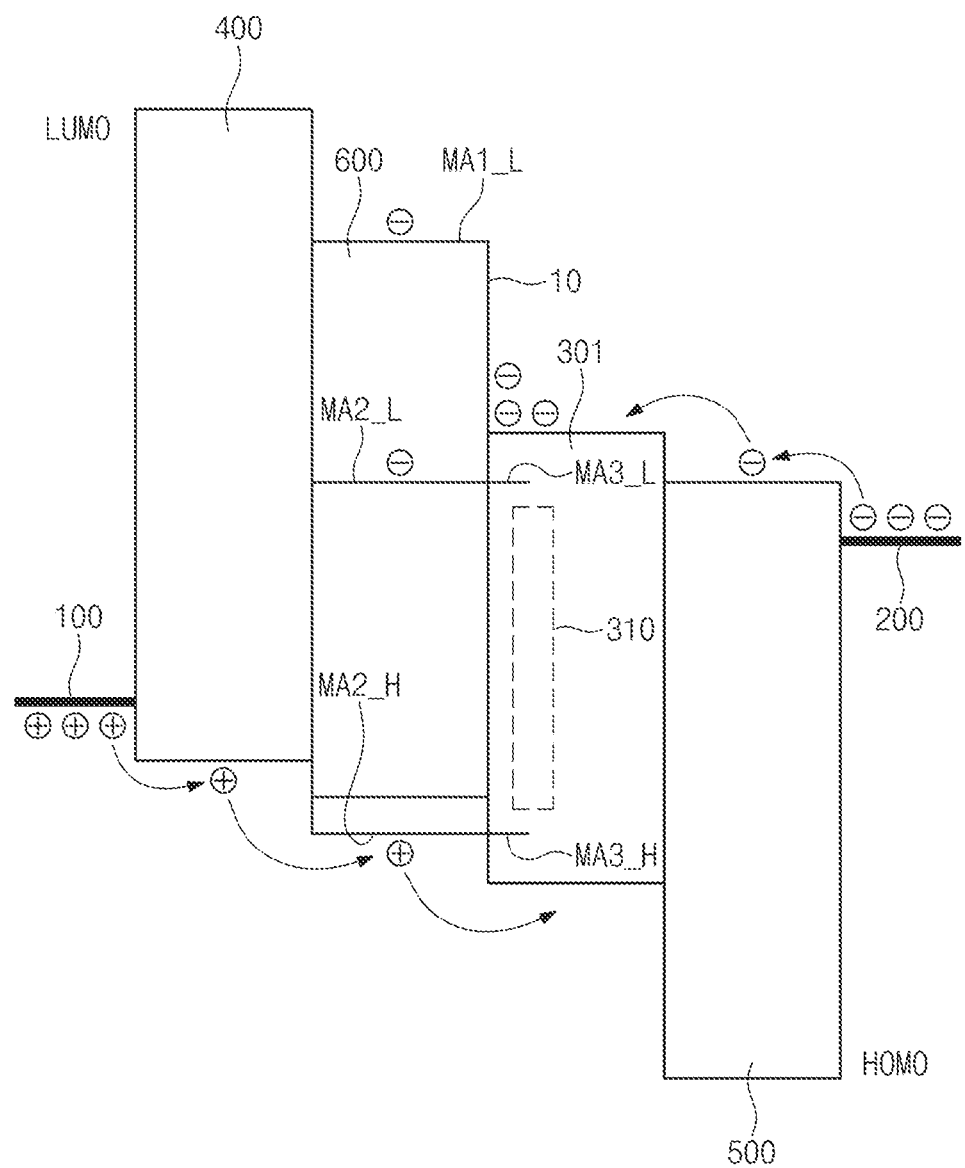
FIG. 7 is a band diagram of an organic light emitting diode according to an exemplary embodiment of the present invention.

FIG. 7 is a band diagram of the organic light emitting diode according to an exemplary embodiment of the present invention.

Referring to FIG. 7, an emitting layer 301 may further include a third material. According to the present exemplary embodiment, the third material may be substantially the same material as the second material MA2 included in the auxiliary layer 600.

The third material may be evenly dispersed in the emitting layer 301, and may be unevenly dispersed in the emitting layer 301 as illustrated in FIG. 7.

According to the present exemplary embodiment, the third material may have an energy band gap which may not affect light emission of the emitting layer 301. For example, the energy band gap of the third material may be larger than an energy band gap of the dopant material 310. Therefore, the third material may not affect light emission of the emitting layer 301.

Since the emitting layer 301 includes the third material, excess electrons may be prevented from being concentrated on an interface between the auxiliary layer 600 and the emitting layer 301. Accordingly, since the interface between the auxiliary layer 600 and the emitting layer 301 may be prevented from being deteriorated, a lifespan of the OLED may be improved.

Figure 8:
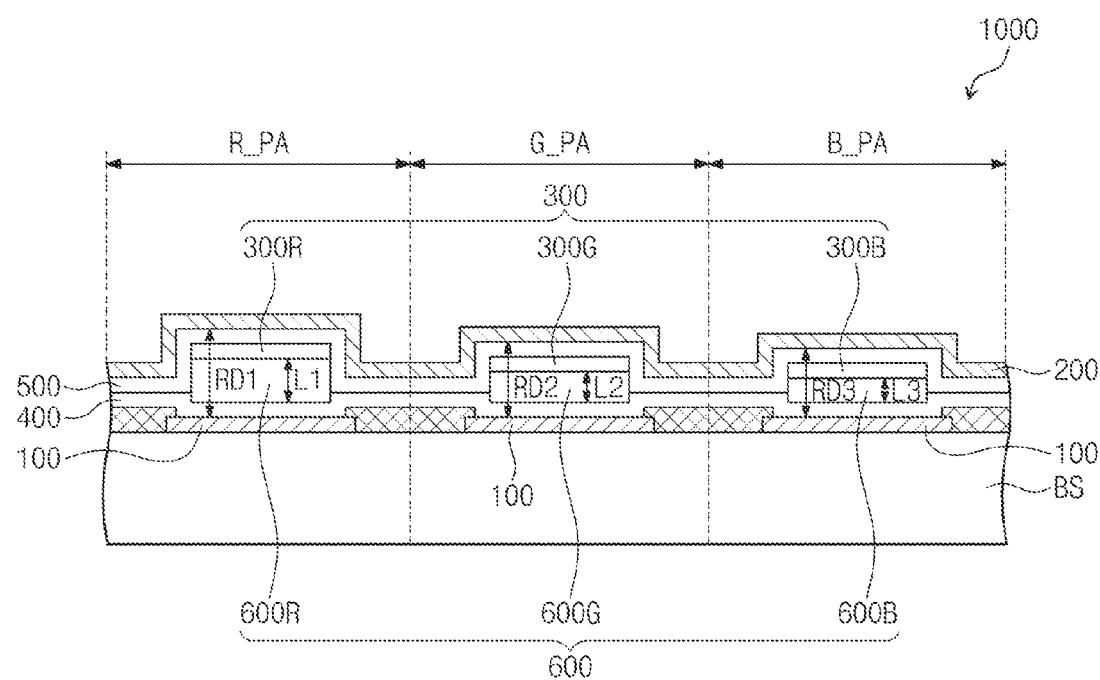
FIG. 8 is a cross-sectional view schematically illustrating pixel regions of a display device according to an exemplary embodiment of the present invention.

FIG. 8 is a cross-sectional view schematically illustrating pixel regions of a display device according to an exemplary embodiment of the present invention. Specifically, FIG. 8 is a cross-sectional view schematically illustrating organic light emitting diodes disposed at each of a first pixel region R_PA, a second pixel area G_PA, and a third pixel region B_PA emitting light of different wavelengths from each other in a display device 1000.

An emitting layer 300 may be divided into a first emitting layer 300R, a second emitting layer 300G, and a third emitting layer 300B according to a wavelength of emitted light. According to the present exemplary embodiment, the first emitting layer 300R may emit red light, the second emitting layer 300G may emit green light, and the third emitting layer 300B may emit blue light.

An auxiliary layer 600 may include a first auxiliary layer 600R, a second auxiliary layer 600G, and a third auxiliary layer 600B. The first auxiliary layer 600R may be disposed between the first emitting layer 300R and a hole transport region 400, the second auxiliary layer 600G may be disposed between the second emitting layer 300G and the hole transport region 400, and the third auxiliary layer 600B may be disposed between the third emitting layer 300B and the hole transport region 400.

According to the present exemplary embodiment, the auxiliary layer 600 may control excess electrons and adjust the resonance distance. For example, when resonance orders are the same, the thickness of the auxiliary layer 600 may be proportional to the wavelength of light emitted from the emitting layer 300.

A first resonance distance RD1 of the first pixel region R_PA, a second resonant distance RD2 of the second pixel area G_PA, and a third resonance distance RD2 of the third pixel region B_PA may be different from each other. For example, since the first emitting layer 300R disposed on the first pixel region R_PA emits red light of the longest wavelength, the first resonance distance RD1 may be greater than the second resonance distance RD2 and the third resonance distance RD3. In addition, since the third emitting layer 300B disposed on the third pixel region B_PA emits blue light of the shortest wavelength, the third resonance distance RD3 may be smaller than the first resonance distance RD1 and the second resonance distance RD2.

Therefore, the first auxiliary layer 600R may be thicker than the second auxiliary layer 600G and the third auxiliary layer 600B. The second auxiliary layer 600G may be thinner than the first auxiliary layer 600R and thicker than the third auxiliary layer 600B. The third auxiliary layer 600B may be thinner than the first auxiliary layer 600R and the second auxiliary layer 600G.

According to the present exemplary embodiment, the auxiliary layer 600 may control a color coordinate by adjusting the resonance distance between a first electrode layer 100 and a second electrode layer 200 according to a wavelength of light emitted from the emitting layer 300. In addition, since the auxiliary layer 600 prevents excess electrons from moving from the emitting layer 300 to the hole transport region 400, luminescent efficiency of light emitting diode and a lifespan characteristic of the organic light emitting diode may be improved.

Figure 9:
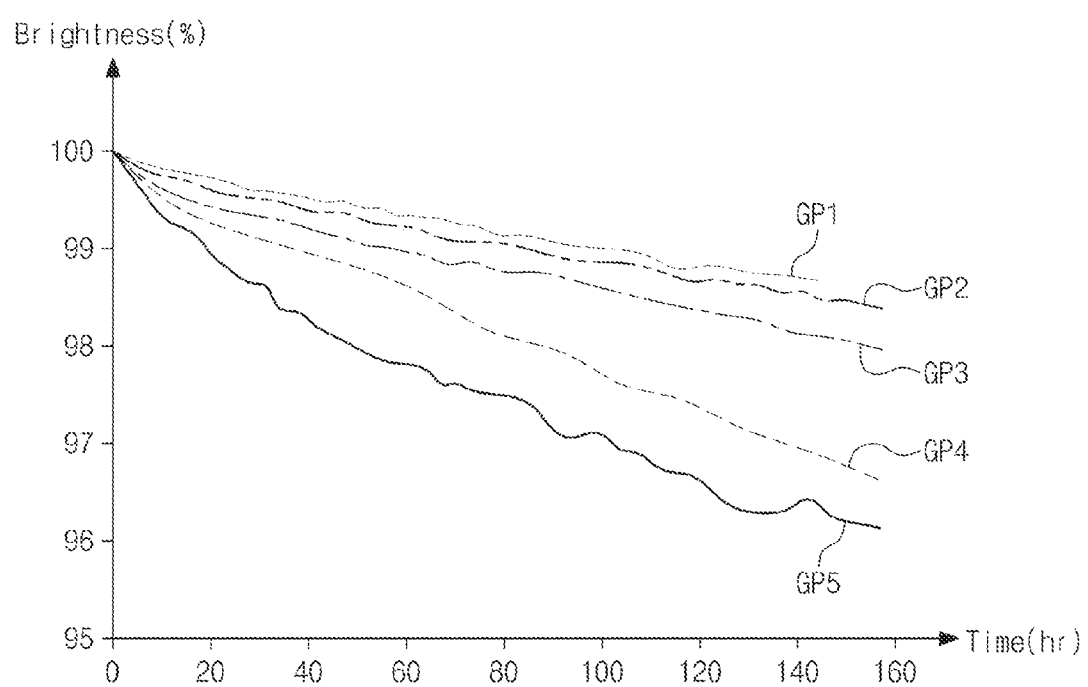
FIG. 9 is a graph illustrating changes in brightness of an organic light emitting diode over time.
Figure 10:
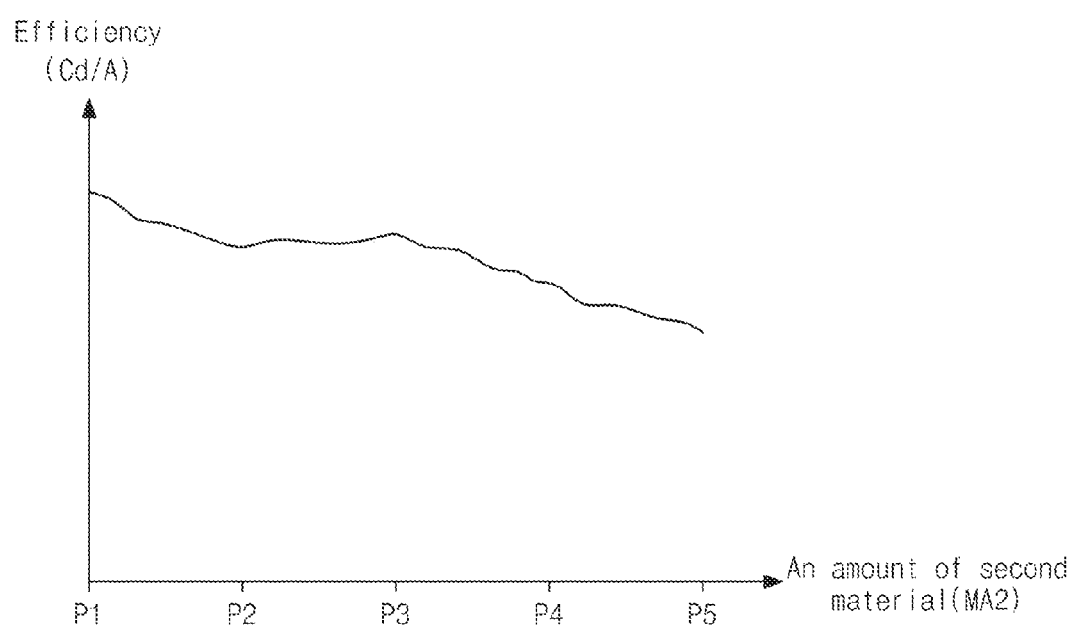
FIG. 10 is a graph illustrating changes in efficiency according to an amount of material included in an auxiliary layer.

FIG. 9 is a graph illustrating a change in brightness of the organic light emitting diode over time and FIG. 10 is a graph illustrating a change in efficiency according to an amount of a material included in an auxiliary layer. The graphs of FIGS. 9 and 10 illustrate changes in a lifespan and efficiency according to proportion of the first material MA1 (see FIG. 3) and the second material MA2 (see FIG. 3) included in the auxiliary layer 600 (see FIG. 3).

Referring to FIGS. 3 and 9, a first graph GP1 illustrates a change in brightness of the OLED over time when the auxiliary layer 600 includes only the second material MA2. A second graph GP2 illustrates a change in brightness of the OLED are illustrated over time when the auxiliary layer 600 includes the first material MA1 and the second material MA2 at a ratio of 1 to 3. A third graph GP3 illustrates a change in brightness of the OLED over time when the auxiliary layer 600 includes the first material MA1 and the second material MA2 at a ratio of 1 to 1. A fourth graph GP4 illustrates a change in brightness of the OLED over time when the auxiliary layer 600 includes the first material MA1 and the second material MA2 at a ratio of 3 to 1. A fifth graph GP5 illustrates a change in brightness of the OLED over time when the auxiliary layer 600 includes only the first material MA1.

Referring to the first to fifth graphs GP1, GP2, GP3, GP4, and GP5, it may be seen that as the proportion of the second material MA2 in the auxiliary layer 600 becomes higher, a lifespan exhibits an increasing tendency.

The second material MA2 may prevent an interface between the auxiliary layer 600 and the emitting layer 300 from being deteriorated by distributing electrons concentrated between the emitting layer 300 and the auxiliary layer 600 and by trapping electrons excessively injected into the auxiliary layer 600. In addition, the second material MA2 may prevent from electrons from being injected into the hole transport region 400. Accordingly, a lifespan of the organic light emitting diode may be improved as the proportion of the second material MA2 becomes higher.

FIG. 10 is a graph illustrating changes in efficiency (Cd/A, luminescent efficiency) according to an amount of a second material included in an auxiliary layer. Referring to FIGS. 3 and 10, a first point P1 indicates an efficiency when the auxiliary layer 600 includes only the first material MA1, a second point P2 indicates an efficiency when the auxiliary layer 600 includes the first material MA1 and the second material MA2 at a ratio of 3 to 1, a third point P3 indicates an efficiency when the auxiliary layer 600 includes the first material MA1 and the second material MA2 at a ratio of 1 to 1, a fourth point P4 indicates an efficiency when the auxiliary layer 600 includes the first material MA1 and the second material MA2 at a ratio of 1 to 3, and a fifth point P5 indicates an efficiency when the auxiliary layer 600 includes only the second material MA2.

Referring to efficiency values at each of the first to fifth points P1, P2, P3, P4, and P5, it can be seen that as the proportion the first material MA1 in the auxiliary layer 600 goes higher, an efficiency exhibits an increasing tendency. The first material MA1 may prevent electrons from moving from the emitting layer 300 to the hole transport region 400. Therefore, excitons may be more easily formed in the emitting layer 300 by the first material MA1, and as a result, luminescent efficiency of the OLED may be improved.

According to the present exemplary embodiment, the auxiliary layer 600 includes the first material MA1 and the second material MA2. Therefore, contents of the first material MA1 and the second material MA2 may be adjusted suitably for a characteristic of the display device 1000 and needs of consumers. When the auxiliary layer 600 is used according to the present exemplary embodiment, the auxiliary layer 600 may be easily applied to a variety of product specifications by only adjusting the contents of the first material MA1 and the second material MA2, without an additional structural change of the OLED.

According to the exemplary embodiments of the present invention, an organic light emitting diode is disposed between the emitting layer and the hole transport region, and includes an auxiliary layer including the first and second materials. The first material of the auxiliary layer has a lowest unoccupied molecular orbital energy level higher than a lowest unoccupied molecular orbital energy level of the emitting layer. As a result, the first material may prevent electrons from moving from the emitting layer to the hole transport region. The second material has a lowest unoccupied molecular orbital energy level lower than a lowest unoccupied molecular orbital energy level of the emitting layer. The second material may hold excess electrons moved from the emitting layer.

Therefore, excitons may be more easily formed by the first material in the emitting layer, and as a result, luminescent efficiency of the organic light emitting diode may be improved. In addition, an interface between the emitting layer and the auxiliary layer may be prevented from being deteriorated by the second material, and excess electrons introduced into the auxiliary layer may be prevented from moving to the hole transport region. Accordingly, a lifespan of the organic light emitting diode may be improved by the second material.

Further, since an organic light emitting diode according to the exemplary embodiments of the present invention includes a third material that is the same as the second iii material in the emitting layer, excess electrons may be prevented from being concentrated on an interface between the auxiliary layer and the emitting layer. Therefore, the interface between the auxiliary layer and the emitting layer may be prevented from being deteriorated, and as a result, a lifespan of the organic light emitting diode may be improved.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. An organic light emitting diode, comprising:
a first electrode layer disposed on a base substrate;
a second electrode layer disposed on the first electrode layer and facing the first electrode layer;
an emitting layer disposed between the first electrode layer and the second electrode layer;
a hole transport region disposed between the emitting layer and the first electrode layer;
an auxiliary layer disposed between the hole transport region and the emitting layer, the auxiliary layer comprising a first material and a second material; and
an electron transport region disposed between the emitting layer and the second electrode layer,
wherein:
a lowest unoccupied molecular orbital (LUMO) energy level of the first material is higher than a LUMO energy level of the emitting layer;
a LUMO energy level of the second material is lower than the LUMO energy level of the emitting layer; and
a highest occupied molecular orbital (HOMO) energy level of the first material is higher than a HOMO energy level of the second material.

2. The organic light emitting diode of claim 1, wherein:
the emitting layer comprises a host material and a dopant material;
the LUMO energy level of the first material is higher than a LUMO energy level of the host material; and
the LUMO energy level of the second material is lower than the LUMO energy level of the host material.

3. The organic light emitting diode of claim 2, wherein:
the emitting layer further comprises a third material; and
the third material is the same as the second material.

4. The organic light emitting diode of claim 3, wherein an energy band gap of the third material is larger than an energy band gap of the dopant material.

5. The organic light emitting diode of claim 2, wherein the auxiliary layer comprises:
a first layer comprising the first material; and
a second layer comprising the first and second materials,
wherein the first layer is disposed between the second layer and the emitting layer, and the second layer is disposed between the first layer and the hole transport region.

6. The organic light emitting diode of claim 5, wherein the auxiliary layer further comprises a third layer comprising the first material disposed between the second layer and the hole transport region.

7. The organic light emitting diode of claim 2, wherein the HOMO energy level of the first material and the HOMO energy level of the second material are each higher than a HOMO energy level of the host material.

8. The organic light emitting diode of claim 1, wherein:
the auxiliary layer has a thickness proportional to a wavelength of light emitted from the emitting layer; and
a resonance distance between the first and second electrodes is adjusted by the thickness of the auxiliary layer.

9. A display device, comprising:
a base substrate; and
pixels disposed on the base substrate, each of the pixels comprising an organic light emitting diode,
wherein the organic light emitting diode comprises:
a first electrode layer disposed on the base substrate;
a second electrode layer disposed on the first electrode layer and facing the first electrode layer;
an emitting layer disposed between the first and second electrode layers;
a hole transport region disposed between the emitting layer and the first electrode layer;
an electron transport region disposed between the emitting layer and the second electrode layer; and
an auxiliary layer disposed between the hole transport region and the emitting layer, the auxiliary layer comprising:
a first material having a lowest unoccupied molecular orbital (LUMO) energy level higher than a LUMO energy level of the emitting layer, the first material being configured to prevent electrons from moving the emitting layer to the hole transport region; and
a second material having a LUMO energy level lower than the LUMO energy level of the emitting layer, and
wherein a highest occupied molecular orbital (HOMO) energy level of the first material is higher than a HOMO energy level of the second material.

10. The display device of claim 9, wherein:
the emitting layer comprises a host material and a dopant material;
the LUMO energy level of the first material is higher than a LUMO energy level of the host material; and
the LUMO energy level of the second material is lower than the LUMO energy level of the host material.

11. The display device of claim 10, wherein:
the emitting layer further comprises a third material;
the third material is the same as the second material; and
an energy band gap of the third material is lager than an energy band gap of the dopant material.

12. The display device of claim 10, wherein the auxiliary layer comprises:
a first layer comprising the first material; and
a second layer comprising the first and second materials,
wherein the first layer is disposed between the second layer and the emitting layer, and the second layer is disposed between the first layer and the hole transport region.

13. The display device of claim 12, wherein the auxiliary layer further comprises a third layer comprising the first material disposed between the second layer and the hole transport region.

14. The display device of claim 10, wherein the HOMO energy level of the first material and the HOMO energy level of the second material are each higher than a HOMO energy level of the host material.

15. The display device of claim 10, wherein:
the emitting layer comprises a first emitting layer emitting light having a first wavelength and a second emitting layer emitting light having a second wavelength shorter than the first wavelength; and
when the auxiliary layer comprises a first auxiliary layer disposed between the first emitting layer and the hole transport region, and a second auxiliary layer disposed between the second emitting layer and the hole transport region, the first auxiliary layer is thicker than the second auxiliary layer.

16. A method of manufacturing an organic light emitting diode, the method comprising:
forming a first electrode layer on a base substrate;
forming a hole transport region on the first electrode layer;
forming an auxiliary layer comprising a first material and a second material on the hole transport region;
forming an emitting layer on the auxiliary layer;
forming an electron transport region on the emitting layer; and
forming a second electrode layer on the electron transport region,
wherein:
a lowest unoccupied molecular orbital (LUMO) energy level of the first material is higher than a LUMO energy level of the emitting layer;
a LUMO energy level of the second material is lower than the LUMO energy level of the emitting layer; and
a highest occupied molecular orbital (HOMO) energy level of the first material is higher than a HOMO energy level of the second material.

17. The method of claim 16, wherein forming the auxiliary layer comprises:
forming a first layer comprising the first material between the emitting layer and the hole transport region; and
forming a second layer comprising the first and second materials between the first layer and the hole transport region.

18. The method of claim 16, wherein each of the HOMO energy level of the first material and the HOMO energy level of the second material is higher than a HOMO energy level of a host material of the emitting layer.

* * * * *